United States Patent [19]

McNulty et al.

[11] Patent Number: 5,770,816
[45] Date of Patent: Jun. 23, 1998

[54] PLANAR, HERMETIC METAL MATRIX HOUSING

[75] Inventors: Michael Kevin McNulty, Cherry Hill, N.J.; Bradley David Dufour, Philadelphia, Pa.

[73] Assignee: Lockheed Martin Corp., Moorestown, N.J.

[21] Appl. No.: 815,349

[22] Filed: Mar. 11, 1997

[51] Int. Cl.⁶ ...................................................... H05K 5/06
[52] U.S. Cl. ........................ 174/52.3; 257/704; 257/698; 257/723; 174/52.4
[58] Field of Search .................................. 257/698, 704, 257/723, 684; 174/52.3, 52.4

[56] References Cited

U.S. PATENT DOCUMENTS

5,138,436  8/1992  Koepf ...................................... 257/728
5,552,633  9/1996  Sharma ................................... 257/700

*Primary Examiner*—Kristine L. Kincaid
*Assistant Examiner*—Hung V. Ngo
*Attorney, Agent, or Firm*—W. H. Meise; S. D. Weinstein; S. A. Young

[57] ABSTRACT

A hermetically sealed housing for plural GaAs chips includes a body made from Al/SiC. The body defines a peripheral seal ring support surface, an electrical connector insert support surface and an end wall to which a ceramic insert is mounted. The insert includes a first portion with an upper surface within the sealed housing, Which upper surface is coplanar with the upper surface of the body, for convenient HDI film connections to the chips and electrical connector inserts. The refractory electrical conductors extend from the upper surface of the first portion of the insert to an exterior terminal portion of the insert. The terminal portion of the insert is spaced from the first portion of the insert by a non-terminal portion containing no terminals. The non-terminal portion of the insert is coplanar with the seal ring support surface of the body, and contiguous therewith. The insert, a titanium seal ring, and the body are hermetically joined by aluminum, which fills the pores of the body and the interstices between the body, the insert, and the seal ring. A domed lid is sealed to the seal ring.

9 Claims, 4 Drawing Sheets

PLANAR, HERMETIC METAL MATRIX HOUSING

FIELD OF THE INVENTION

This invention relates to a hermetically sealed housing for one or more GaAs microelectronic packages, which is particularly adapted for use with High-Density Interconnect assembly techniques, and more particularly relates to such a housing made from Al/SiC, in which the connections between the sealed portion and the outside world are provided by metallized ceramic bonded to the housing

BACKGROUND OF THE INVENTION

Modem electronic equipment is, for the most part, dominated by microelectronic "chips," each of which may contain hundreds of thousands or millions of transistors. The fabrication techniques for such chips is such that, in quantity, the cost of an individual chip is very small. Chips which are in commercial use tend to be very inexpensive. On the other hand, chips which are fabricated with specialized functions, such as those used for military purposes, may be very expensive, because the initial cost of design and fabrication set-up is not distributed over a large number of units.

For many purposes, it is desirable to concatenate many such chips into systems having a defined function. When chips are to be used in hostile environments, a need arises to protect each of the chips of the system from the environment, and to interconnect the chips together to form a functioning system. In those situations in which the chips of a system are all of the commercial variety, they may be sealed into a package in any convenient manner, and the chip cost may be so low that, if a failure occurs in one of the chips so that the system becomes inoperative, the entire package can be discarded, rather than repaired. On the other hand, when expensive, special-purpose chips are included in the package, the cost of those chips, may be so great that repair of the entire package is mandated.

The High-Density Interconnect (HDI) arrangement is a packaging arrangement for packaging a plurality of microcircuit chips on a protective carrier, and interconnecting the electrodes of the various chips in a manner who defines the desired system by means of a multilayer dielectric film with conductive paths and layer-to-layer visa. The HDI arrangement is capable of being repaired, as by removing the interconnecting film, removing and replacing the defective microcircuit chip of the HDI assembly, and replacing the overlying interconnecting film, possibly with a new film. The HDI arrangement is described in those U.S. Patents listed in U.S. Pat. No. 5,552,633, issued Sep. 3, 1996, in the name of Sharma.

Among the problems associated with the use of multitudes of semiconductor chips in a single housing is that of providing a suitably high thermal conduction path between the chips and an ultimate heat sink. Another problem is that of making a reliable thermal connection between the semiconductor chip and the housing to which heat is to be conducted. The housing should be hermetically sealed so that the semiconductor chips are not exposed to a corrosive or damaging atmospheric substances, and should be as inexpensive to fabricate as possible. Since the system using the semiconductor chips is likely to be complex, the electrical interconnections among the chips themselves, and between the chips and the outside world, should be reliable, and in the case of the connections between the chips and the outside world should be hermetically sealed.

Improved housings are desired.

SUMMARY OF THE INVENTION

A hermetically sealable microchip housing, according to the invention, is adapted for holding at least one semiconductor chip, and for providing electrically conductive paths from the interior of the housing to the exterior thereof. The housing includes a base member defining a bottom surface, and also defining a lower mesa, an intermediate mesa overlying the lower mesa, and an upper mesa overlying the intermediate mesa. The upper mesa defines a substantially planar top surface and a periphery. The upper portion of the lower mesa defines at least an insert bearing surface lying in a insert bearing surface plane substantially parallel with the top surface. The base member includes at least one recess extending from the top surface of the upper mesa toward the bottom surface, adapted for holding a GaAs semiconductor chip with its upper surface substantially coplanar with the top surface of the upper mesa. The base member further includes at least one flat end wall perpendicular to the top surface, and extending from the top surface of the upper mesa to the insert hearing surface over a selected portion of the periphery of the upper mesa. The intermediate mesa defines a substantially planar ring support surface lying parallel with the upper surface, and extending about the periphery of the upper mesa, except along the selected portion of the periphery of the upper mesa.

The sealable housing also includes a substantially rectilinear insert having a monolithic (one-piece or not disassemblable) stepped body defining a lower surface, and including at least first and second portions. The first portion of the insert defines an upper surface and a flat contact wall having a length dimension substantially equal to the length of the selected portion of the periphery of the upper mesa of the body, and a height dimension between the upper surface of the first portion of the insert and the lower surface of the insert, which height dimension is equal to the dimension of the flat end wall of the body from the top surface of the body to the insert support surface of the body. The second portion of the stepped body of the insert defines at least terminal and non-terminal portions. The non-terminal portion of the second portion of the stepped body of the insert has an upper surface, and the terminal portion also has an upper surface, who may be, in one embodiment of the invention, coplanar with the upper surface of the non-terminal portion. The non-terminal second portion of the stepped body of the insert defines a height between its upper surface and the lower surface of the insert, which height is equal to the distance between the insert bearing surface and the ring support surface of the body of the insert. The insert is made from a dielectric material, and further includes a plurality of electrical conductors extending within the dielectric material from the upper surface of the first portion of the insert to the upper surface of the terminal portion of the second portion of the insert. The electrical conductors do not extend to the upper surface of the non-terminal portion of the second portion of the insert. The electrical conductors are insulated, both from each other and from any contact with external bodies, except at the upper surface of the first portion of the insert and at the upper surface of the terminal portion of the second portion of the insert. The insert is mounted with its contact wall contiguous with the end wall of the body, and with the lower surface of the insert contiguous with the insert support surface of the body, whereby the upper surface of the first portion of the insert is substantially coplanar with the top surface of the body, and the top surface of the non-terminal second portion of the insert is substantially coplanar with the ring support surface of the body over the selected portion of the periphery. The body is hermetically sealed to the insert, at least along the lower surface of the insert and the contact wall of the first portion of the insert. A peripheral sealing ring extends over the ring support surface of the body and the top surface of the non-terminal portion of the second portion of the insert, to form a continuous flat surface about the periphery of the upper mesa. The sealing ring is hermetically fastened to the ring support surface of the body and to the upper surface of the non-terminal portion of the second portion of the insert.

In a particular embodiment of the invention, the upper surface of the terminal portion of the second portion of the insert is coplanar with the upper surface of the non-terminal portion of the second portion of the insert. In another embodiment, the upper surface of the terminal portion of the second portion of the insert is coplanar with, but not contiguous with, the upper surface of the first portion of the insert.

In a preferred embodiment of the invention, the semiconductor chip is a GaAs chip, the body is made from Al/SiC, the insert is made from a ceramic material with cofired refractory conductors, such as of tungsten, and the sealing ring is made from titanium. A domed lid made from, for example, titanium, may be soldered or welded to the titanium sealing ring. One method for fabrication of the housing is to use porous SiC for the body, and to infuse aluminum into the body and into the interstices between the body and the ceramic insert.

Ideally, the recess has a bottom surface who lies parallel with the top surface, and which lies below the top surface by a distance equal to the thickness of the GaAs semiconductor chip. Of course, the body may comprise one or more additional recesses extending from the top surface toward the bottom surface, adapted for holding an additional semiconductor chips.

BRIEF DESCRIPTION OF THE DRAWING

FIG. 1 is a simplified perspective or isometric view, partially exploded to illustrate separate components of a housing according to an aspect of the invention, including a base, an insert, a sealing ring, and a lid;

FIG. 2b illustrates another view of the insert of FIG. 2a;

DESCRIPTION OF THE INVENTION

Figures 1, 2B:
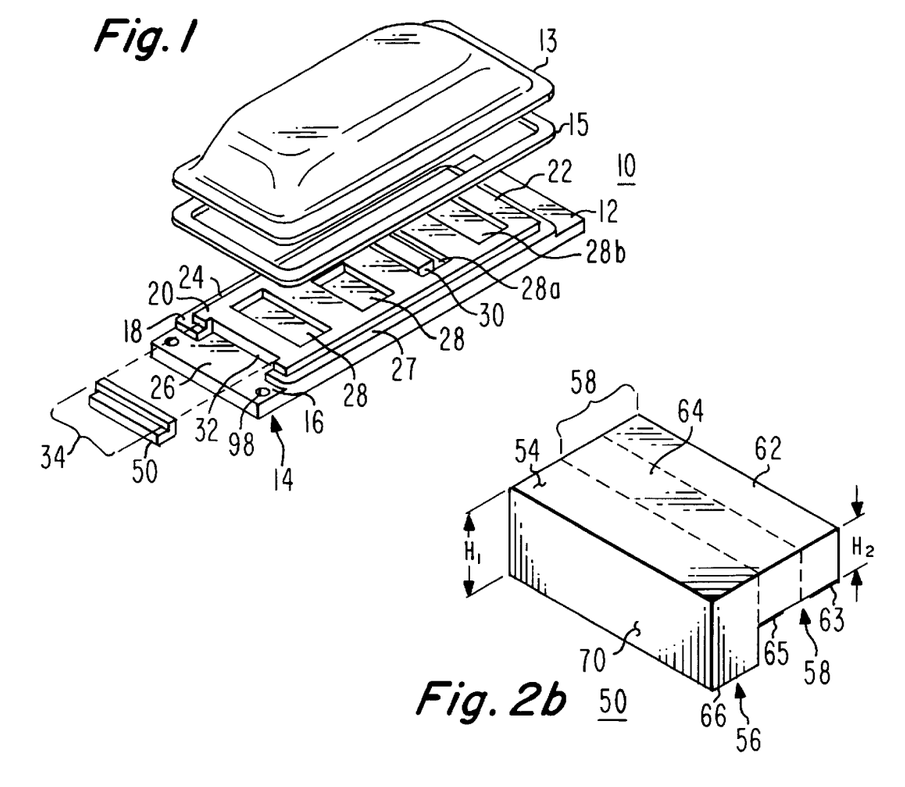
Figure 2A:
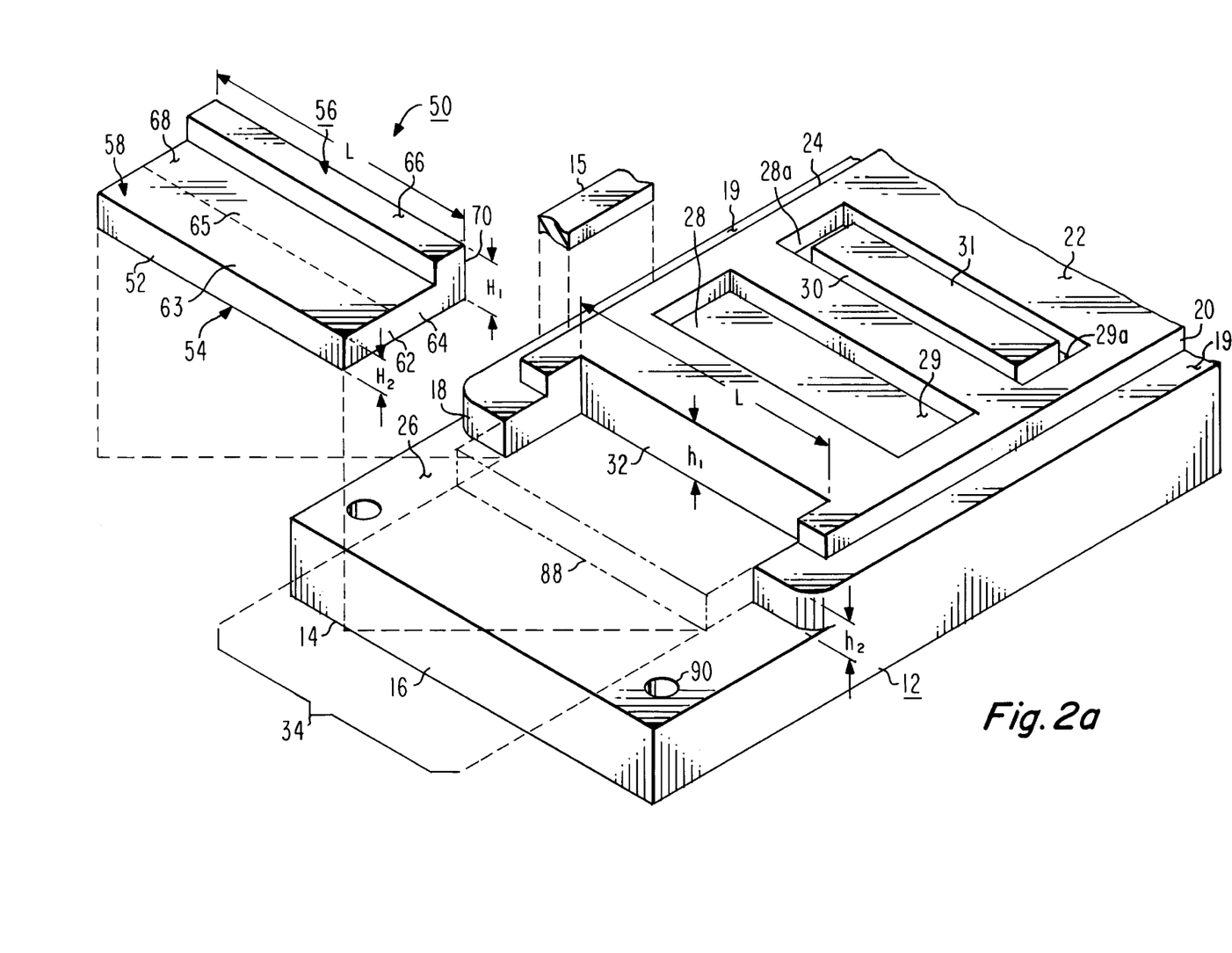
FIG. 2a is a simplified perspective or isometric view, partially exploded, of a portion of the arrangement of FIG. 1 including an end of the base, the insert, and a portion of the sealing ring.

In FIGS. 1 and 2a, a housing 10 includes a base or body 12 made from a thermally conductive material. Body 12 of housing 10 has a bottom surface (visible only at an edge 14) who is preferably flat, so that it may be mounted onto an appropriate heat sink (not illustrated) with the aid of mounting screws (not illustrated) passing through screw clearance apertures, one of who is designated as 90. Body 12 is monolithic, but may be imagined as being in the form of a ziggurat, or as consisting of three stacked mesas or layers, the lowermost of which is designated 16. A second or intermediate mesa 18 has a somewhat smaller area, and is stacked atop lower mesa 16, leaving at least a portion 26, defined in part by dot-dash line 88, of the top surface of the lowermost mesa 16 exposed. As illustrated in FIG. 1, an additional peripheral portion 27 of the top of lowermost mesa 16 is also exposed, but this portion 27 is not used for any purpose in this embodiment of the invention. The exposed top surface portion 26 of lowermost mesa 16 is used to support an insert, as described below, and is therefore referred to as an insert support surface 26. A third or upper mesa 20, somewhat smaller in area than the intermediate mesa, is stacked atop intermediate mesa 18, leaving a peripheral upper "sealing ring support" surface 19 of the intermediate mesa 18 exposed. Upper mesa 20 has a flat upper surface 22, and defines a periphery by a boundary 24. Boundary 24 extends all the way around upper mesa 20, except in a selected region 34, at which the upper edge of an end wall 32 defines the periphery.

As illustrated in FIGS. 1 and 2a, a plurality of cavities or apertures, including apertures 28, 28a, and 28b, extend from upper surface 22 of upper mesa 20 downward toward lower surface 14 of housing body 12. These cavities are provided for accommodating semiconductor chips or substrates in positions appropriate for HDI interconnections, which means that the cavities define bottoms, such as 29 and 29a, which are flat in order to provide a good heat-sinking surface to the chips, and which are spaced from upper surface 22 by a distance which depends upon the thickness of the chip to be accommodated, so that the upper surface of the chip, such as upper surface 31 of chip 30, is substantially in the same plane as (coplanar with) the upper surface 22. The HDI connecting film (not illustrated) can then extend over the chips and provide interconnections thereto, in known manner.

FIGS. 1 and 2a also illustrate, in exploded location, the sealing ring 15. Sealing ring 15 is dimensioned to fit over ring support surface 19, and to extend, as further described below, about the periphery of upper mesa 20.

As illustrated in FIGS. 1 and 2a, an end wall 32 extends vertically or orthogonally from upper surface 22 of body 12 down through the intermediate mesa 18, and ends at top (insert bearing) surface 26 of the lower mesa 16. The height of end wall 32 is defined as $h_1$. The peripheral top surface 19 of intermediate mesa 18 lies between the upper surface 22 of body 12 and the insert bearing surface 26 of the lower mesa 16, at a height $h_2$ above insert bearing surface 26. The length of end wall 32 is L.

Also illustrated in FIGS. 2a and 2b is an insert 50 with a body 52 made principally from a dielectric material. Body 52 of insert 50 is stepped, and generally or grossly defines a first portion 56 having a height $H_1$ between a lower surface 54 and an upper surface 66, and also defines a second portion 58 including at least a portion having a height $H_2$ between bottom surface 54 and an upper portion 68. Height $H_1$ of of the upper surface 66 of the first portion 56 is made equal to height $h_1$ of end wall 32 of body 12, and the length of at least the first portion 56 of the body 52 of insert 50 is made e to the length L of end wall 32.

For explanatory purposes, the second portion 58 of body 52 of insert 50 of FIGS. 2a and 2b is illustrated as being divided into "terminal" and "non-terminal" portions 62 and 64, respectively, each of who has an upper surface 63 and 65, respectively. As illustrated in FIGS. 2a and 2b, upper surfaces 63 and 65 are coplanar, and the combined upper surface is designated as 68.

Figure 3:
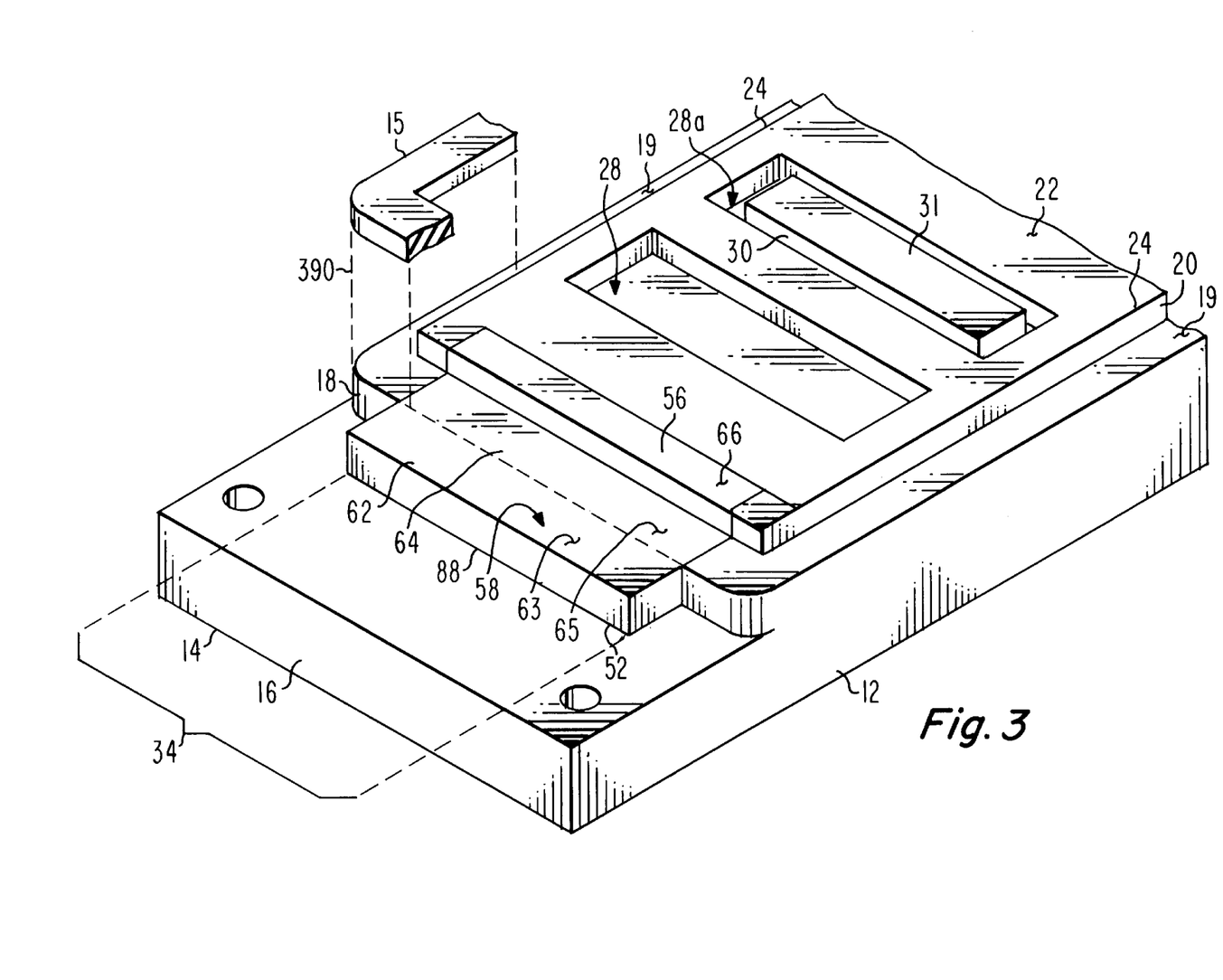
FIG. 3 is a simplified perspective or isometric view similar to FIG. 2, but showing the insert assembled to the base.

FIG. 3 illustrates body 12 of housing 10 assembled with body 52 of insert 50, with the bottom surface 54 (not visible in FIG. 3) of the insert 50 overlying insert support surface 26 of body 12, and with insert wall 70 against end wall 32 of body 12. The selection of the dimensions is such as to make adjoining walls contiguous (close to each other, and either touching or not touching). As illustrated in FIG. 3, the upper surface 66 of first portion 56 of body 52 of insert 50 lies in the same plane as upper surface 22 of body 12 of housing 10, and at least upper surface 65 of the non-terminal portion 64 of second portion 58 of insert body 52 is coplanar with ring support surface 19. The portion of sealing ring 15 illustrated in FIG. 3 includes a bend, and projection lines 390 shows how the sealing ring 15 fits over a portion of ring support surface 19 and over the upper surface 65 of non-terminal portion 64 of body 52 of insert 50.

Figure 4A:
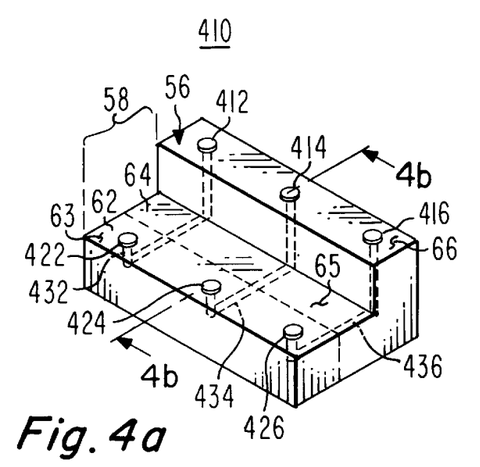
FIG. 4a illustrates the insert in perspective or isometric view.
Figure 4B:
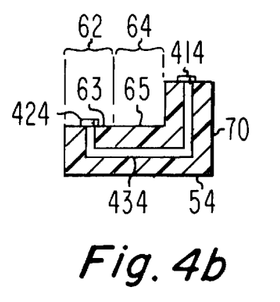
FIG. 4b is a cross-sectional view taken along section lines 4b—4b of FIG. 4a, showing the paths of the electrical conductors through the insert.

FIGS. 4a and 4b illustrate how the electrical conductors extend through the insert body 52. In FIGS. 4a and 4b, three terminals 412, 414, and 416 are formed on the upper surface 66 of first portion 56 of insert 50. Three corresponding terminals 422, 424, and 426 are formed on the upper surface 63 of the terminal portion 62 of second portion 58 of body 52 of insert 50. A set of conductors 432, 434, and 436 extends between terminal sets 412, 422; 414, 424; and 416, 426, respectively, thereby providing communication between the interior and exterior of the housing when it is sealed. The electrical conductors 432, 434, and 436 are insulated from each other by the dielectric or electrically nonconductive nature of the insert body 52. The only contact to electrical conductors 432, 434, and 436 can occur at their respective terminals. The location of terminals 412, 414, and 416, who is coplanar with the upper surface 22 of body 12 of housing 10, is ideal for connection by HDI film.

According to an aspect of the invention, the semiconductor chips include those made with gallium arsenide (GaAs) technology, well known for properties superior to those of silicon-based technology. The body 12 of housing 10 is made principally from aluminum silicon carbide (Al/SiC), who is a good thermal conductor, and which has a coefficient of thermal expansion (CTE) which is approximately equal to that of GaAs, so as to reduce thermally induced stresses in the GaAs chips. The insert body (52) is made from a fired ceramic material, preferably from a high-alumina ceramic which has a CTE somewhere near that of Al/SiC. The electrical conductors and terminals are made from tungsten (W) or other refractory metal electrical conductor. The insert body is hermetically connected with body 12 by infusing liquid aluminum (Al) into the porous SiC body, so that the aluminum wets at least portions of the bottom wall 54 and the side wall 70. The sealing ring 15 is made from titanium (Ti), who may be high-temperature soldered, brazed, or welded to the sealing ring support surface 19 and the non-terminal surface 65 of the insert. In another embodiment of the invention, the sealing ring 15 is made from titanium (Ti), and is hermetically joined to the sealing ring support surface 19 and the non-terminal surface 65 of the insert by means of an aluminum filler. The lid 13 may be made from any inexpensive metal, such as titanium, which may be low-temperature soldered, brazed, or welded to the sealing ring 15.

The body 52 of ceramic insert 50 may be made by laying up layers of green or unfired ceramic material, which are imprinted with the appropriate conductor paths, pads, and vias, then compressing the layers in a mold, and then firing the resulting molded ceramic. The conductors are made from tungsten so that they do not melt during the firing of the ceramic or during the aluminum infiltration process.

Figures 5A, 5B, 6:
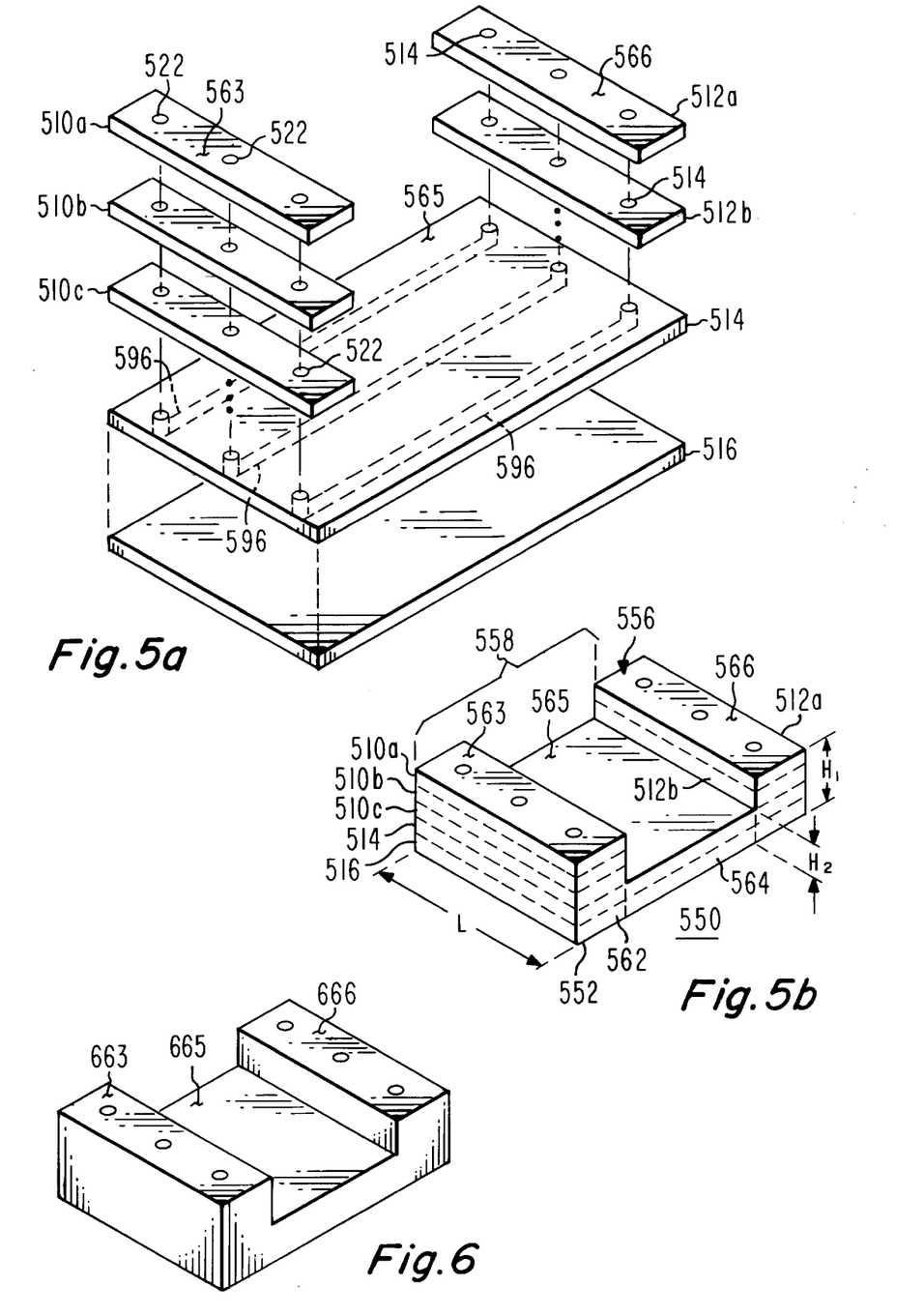

FIG. 5a is an exploded view of the green ceramic layers of an insert according to another embodiment of the invention. In FIG. 5a, a plurality of layers 510a, 510b, 510c, ... are stacked, with their through via metallizations, some of which are designated 522, registered or aligned. A similar stack, which may be of a different number, of layers 512a, 512b, ... is stacked with their through vias, some of which are designated 514, aligned. The two stacks are superposed over a larger layer 514 of ceramic, which has through vias aligned with vias 522 at one end, and with vias 514 at the other end. A set of conductors extends between vias on the topside of ceramic layer 516, and is illustrated by dash-line conductors 596. The conductors 596 on the underside of ceramic layer 514 are insulated from the outside world by a further layer 516 of green ceramic, which has no conductor pattern.

When the layers of FIG. 5a are compressed in a mold and fired, the resulting insert may have the shape illustrated as 550 of FIG. 5b. In FIG. 5b, the various layers of FIG. 5a are illustrated, together with the gross features which they form in their molded form. Certain portions or features of the insert 550 of FIG. 5b are designated by the same reference numerals as those used for corresponding features of the insert 50 of FIGS. 2a, 2b, 3, 4a, and 4b, but in the 500 series. The insert 550 defines a body 552, which may be vie as consisting of a first portion 556 with an upper surface 566, and a second portion 558. Second portion 558 of body 552 of insert 550 is conceptually and actually divided into two portions, a terminal portion 562 and a non-terminal portion 564. Unlike the arrangement of insert 50, the upper surfaces 563 and 565 of terminal portion 562 and non-terminal portion 564, respectively, of body 552 of insert 550, are not coplanar. With this arrangement, the upper or terminal surface of terminal portion 562 of body 552 of insert 550 may be at any height relative to upper surface 566 of first portion 556 of the body, and in particular the terminal surfaces may be coplanar, as illustrated by terminal surfaces 663 and 666 in FIG. 6, which are separated by a lower or depressed non-terminal portion 665. Naturally, the sealing ring, such as 15 of FIGS. 1 and 2b, fits into the groove or depression in which the non-terminal portion lies.

Thus, a hermetically sealable housing (10) according to the invention is adapted for holding at least one semiconductor chip (30), and for providing electrically conductive paths (432, 434, 436) from the interior of the housing (10) to the exterior thereof. The housing (10) includes a base member (12) defining a bottom surface (14), and also defining a lower mesa (16), an intermediate mesa (18) overlying the lower mesa (16), and an upper mesa (20) overlying the intermediate mesa (18). The upper mesa (20) defines a substantially planar top surface (22) and a periphery (24). The upper portion of the lower mesa (16) defines at least an insert bearing surface (26) lying in a insert bearing surface plane substantially parallel with the top surface (22). The base member (12) includes at least one recess (28) extending from the top surface (22) of the upper mesa (20) toward the bottom surface (14), adapted for holding a GaAs semiconductor chip (30) with its upper surface (31) substantially coplanar with the top surface (22) of the upper mesa (20). The base member (12) further includes at least one flat end wall (32) perpendicular to the top surface (22), and extending from the top surface (22) of the upper mesa (20) to the insert bearing surface (26) over a selected portion (34) of the periphery (24) of the upper mesa (20). The intermediate mesa (18) defines a substantially planar ring support surface (19) lying parallel with the upper surface (22), and extending about the periphery (24) of the upper mesa (20), except along the selected portion (34) of the periphery (24) of the upper mesa (20).

The sealable housing (10) also includes a substantially rectilinear insert (50) having a monolithic stepped body (52) defining a lower surface (54), and including at least first (56) and second (58) portions. The first portion (56) of the insert (50) defines an upper surface (66) and a flat contact wall (70) having a length dimension (L) substantially equal to the length of the selected portion (34) of the periphery (24) of the upper mesa (20) of the body (12), and a height dimension ($H_1$) between the upper surface (66) of the first portion (56) of the insert (50) and the lower surface (54) of the insert (50), which height dimension ($H_1$) is equal to the dimension ($h_1$) of the flat end wall (32) of the body (12) from the top surface (22) of the body (12) to the insert support surface (26) of the body (12). The second portion (58) of the stepped body (52) of the insert (50) defines terminal (62) and non-terminal (64) portions. The terminal portion (62) of the insert defines an upper surface 63, and the non-terminal portion (64) of the second portion (58) defines an upper surface (65). The second portion (58) of the stepped body (52) of the insert (50) also defines a height (Hi) between the upper surface (65) of the non-terminal portion (64) of the second portion (58) of the insert (50) and the lower surface (54) of the insert (50), which height ($H_2$) is equal to the height or distance ($h_2$) between the insert bearing surface (26) and the ring support surface (19) of the body (12) of the insert (50). The insert (50) is made from a dielectric material, and further includes a plurality of electrical conductors (432, 434, 436) extending within the dielectric material from the upper surface (66) of the first portion (56) of the insert (50) to the upper surface (63) of the terminal portion (62) of the second portion (58) of the insert (50). The electrical conductors (432, 434, 436) do not extend to the upper surface (65) of the non-terminal portion (64) of the second portion (58) of the insert (50). The electrical conductors (432, 434, 436) are insulated, from each other and from any contact with external bodies, except at the upper surface (66) of the first portion (56) of the insert (50) and at the upper surface (63) of the terminal portion (62) of the second portion (58) of the insert (50). The insert (50) is mounted with its contact wall (70) contiguous with the end wall (32) of the body (12), and with the lower surface (54) of the insert (50) contiguous with the insert support surface (26) of the body (12), whereby the upper surface (66) of the first portion (56) of the insert (50) is substantially coplanar with the top surface (22) of the body (12), and the upper surface (65) of the non-terminal portion (64) of the second portion (58) of the insert (50) is substantially coplanar with the ring support surface (19) of the body over the selected portion (34) of the periphery (24). The body (12) is hermetically sealed to the insert (50), at least along the lower surface (54) of the insert and the contact wall (70) of the first portion (56) of the insert (50). A peripheral sealing ring (15) extends over the ring support surface (19) of the body (12) and over the top surface (65) of the non-terminal portion (64) of the second portion (58) of the insert (50), to form a continuous flat surface about the periphery (24,34) of the upper mesa (20). The sealing ring (15) is hermetically fastened to the ring support surface (19) of the body (12) and to the upper surface (65) of the non-terminal portion (64) of the second portion (58) of the insert (50).

In a preferred embodiment of the invention, the semiconductor chip (30) is a GaAs chip, the body (12) is made from aluminum silicon carbide (Al/SiC), the insert (50) is made from a ceramic material, such as alumina, with cofired tungsten conductors(432, 434, 436), and the sealing ring (15) is made from titanium. A domed lid (13) made from any suitable material, as for example titanium, may be soldered or welded to the titanium sealing ring (15), one method for fabrication of the housing (10) is to use porous silicon carbide for the body, and to infuse aluminum into the body and into the interstices between the body (12) and the ceramic insert (50), and into the interstices between the sealing ring (15) and the ring support surface (19).

Ideally, the recess (28) has a bottom surface (29) which lies parallel with the top surface (22), and which lies below the top surface (22) by a distance equal to the thickness of the GaAs semiconductor chip (30). Of course, the body (12) may comprise one or more additional recesses (28a, 28b) extending from the top surface (22) toward the bottom surface (14), adapted for holding additional semiconductor chips.

In one embodiment of the invention, the upper surfaces (63, 65) of the terminal and non-terminal portions (62, 64), respectively, are coplanar, and together form a combined surface (68). In another embodiment, the upper surfaces (63, 65) of the terminal and non-terminal portions (62, 64), respectively, are not coplanar, and the upper surface (63) of the terminal portion (62) of the second portion (58) of the insert (50) is instead coplanar with the top surface (22) of the upper mesa (20) of the body (12).

Other embodiments of the invention will be apparent to those skilled in the art. For example, while the description is in terms of orientation of the elements, as, for example, by the use of "upper," "lower," "top," "bottom," and the like, the actual orientation of the housing is irrelevant, and the terms of orientation are merely used for ease of understanding when viewing the drawings, while three conductors 432, 434, 436 have been described, the number of conductors may be appropriate to the application, and when used for high frequencies at which the impedances of some of the conductors may be an important consideration, the dimensions of the wires, and the surrounding dielectric material, are selected to provide the desired value, as well known in the art. While the wall 32 of FIGS. 1 and 2a has been designated as an "end" wall, it may be placed anywhere about the periphery of the housing body 12, and the term "end" is merely descriptive of its position in the illustration, and the claims should be interpreted in a corresponding manner.

What is claimed is:

1. A hermetically sealable housing adapted for holding at least one semiconductor chip, and for providing electrically conductive paths from the exterior of said housing to the interior thereof, said housing comprising:

a base member defining a bottom surface, and also defining a lower mesa, an intermediate mesa overlying said lower mesa, and an upper mesa overlying said intermediate mesa, said upper mesa defining a substantially planar top surface and a periphery, an upper portion of said lower mesa defining at least an insert bearing surface being substantially parallel with said top surface, said base member including at least one cavity extending from said top surface of said upper mesa toward said bottom surface, and adapted for holding a semiconductor chip with the upper surface of said chip substantially coplanar with said top surface of said upper mesa, said intermediate mesa and said upper mesa of said base member further including at least one flat end wall perpendicular to said top surface, and extending from said top surface of said upper mesa to said insert bearing surface over a selected portion of said periphery of said upper mesa, said intermediate mesa defining a substantially planar ring support surface lying parallel with said top surface of said upper mesa, and extending about said periphery of said upper mesa except along said selected portion of said periphery of said upper mesa;

a substantially rectilinear insert having a monolithic stepped body defining a lower surface, and including at least first and second portions, said first portion of said insert defining an upper surface and a flat contact wall having a length dimension substantially equal to the length of said selected portion of said periphery and a height dimension between said upper surface of said first portion of said insert and said lower surface of said insert, said height dimension being equal to the dimension of said flat end wall of said base member from said top surface of said base member to said insert bearing surface of said base member, said second portion of said stepped body of said insert defining at least one upper surface including terminal and non-terminal portions, and also defining a height between said lower surface of said insert and said upper surface of said terminal portion of said second portion of said insert, said height being equal to the distance between said insert bearing surface and said ring support surface of said base member, said insert being made from a dielectric material, and further including a plurality of electrical conductors extending within said dielectric material from said upper surface of said first portion of said insert to said upper surface of said terminal portion of said second portion of said insert, but not to said upper surface of said non-terminal portion of said second portion of said insert, said electrical conductors being insulated except at said upper surface of said first portion of said insert and at said upper surface of said terminal portion of said second portion of said insert, said insert being mounted with said contact wall contiguous with said end wall of said base member, and with said lower surface of said insert contiguous with said insert bearing surface of said base member, whereby said upper surface of said first portion of said insert is substantially coplanar with said top surface of said upper mesa of said base member, and said upper surface of said non-terminal portion of said second portion of said insert is substantially coplanar with said ring support surface of said base member over said selected portion of said periphery, said base member being hermetically sealed to said insert at least along said lower surface of said insert and said contact wall of said first portion of said insert; and a peripheral sealing ring extending over said ring support surface of said base member and said top surface of said insert, to form a continuous flat surface about said periphery of said upper mesa, said sealing ring being hermetically joined to said ring support surface of said base member and to said upper surface of said nonterminal portion of said second portion of said insert.

2. A housing according to claim 1, wherein said cavity has a bottom surface which lies parallel with said top surface, and which lies below said top surface by a distance equal to the thickness of said semiconductor chip.

3. A housing according to claim 2, wherein said base member further comprises an additional cavity extending from said top surface toward a bottom surface, adapted for holding a second semiconductor chip.

4. A housing according to claim 1, wherein said sealing ring is hermetically joined to said ring support surface of said base member and to said upper surface of said non-terminal portion of said second portion of said insert.

5. A housing according to claim 1, wherein said semiconductor chip is made from GaAs, the material of said insert is ceramic, and the material of said base member of said housing is porous AlSiC, and said insert, said base member, and said ring are hermetically joined by means of aluminum filler.

6. A housing according to claim 5, further comprising a domed lid dimensioned to bear against said ring, said lid being hermetically joined to said ring.

7. A housing according to claim 6, wherein the material of said ring is titanium.

8. A housing according to claim 1, wherein said upper surface of said terminal portion of said second portion of said insert is coplanar with said top surface of said base member of said housing.

9. A hermetically sealable housing adapted for holding at least one GaAs semiconductor chip, and for providing electrically conductive paths from the exterior of said housing to the interior thereof, said housing comprising:

a base member, made principally from AlSiC, said base member defining a bottom surface, and also defining a lower mesa, an intermediate mesa overlying said lower mesa, and an upper mesa overlying said intermediate mesa, said upper mesa defining a substantially planar top surface and a periphery, an upper portion of said lower mesa defining at least an insert bearing surface lying substantially parallel with said top surface of said upper mesa, said base member including at least one cavity extending from said top surface of said upper mesa toward said bottom surface, and adapted for holding a GaAs semiconductor chip with the upper surface of said GaAs semiconductor chip substantially coplanar with said top surface of said upper mesa, said intermediate mesa and said upper mesa of said base member including at least one flat end wall perpendicular to said top surface, and extending from said top surface of said upper mesa to said insert bearing surface over a selected portion of said periphery of said upper mesa, said intermediate mesa defining a substantially planar ring support surface lying parallel with said top surface of said upper mesa, and extending about said periphery of said upper mesa except along said selected portion of said periphery of said upper mesa;

a substantially rectilinear ceramic insert having a monolithic stepped body defining a lower surface, and including at least first and second portions, said first portion of said insert defining an upper surface and a flat contact wall having a length dimension substantially equal to the length of said selected portion of said periphery and a height dimension between said upper surface of said first portion of said insert and said lower surface of said insert, said height dimension being equal to the dimension of said flat end wall of said base member from said top surface of said base member to said insert bearing surface of said base member, whereby said first portion of said insert fits to said selected portion of said periphery, said second portion of said stepped body of said insert defining at least terminal and non-terminal portions, each of said terminal and non-terminal portions having an upper surface, and also defining a height between said lower surface of said insert and said upper surface of said non-terminal portion of said second portion of said insert, said height being equal to the distance between said insert bearing surface of said lower mesa and said ring support surface of said base member, said insert further including a plurality of electrical conductors made from refractory material extending within a dielectric material from said upper surface of said first portion of said insert to said upper surface of said terminal portion of said second portion of said insert, but not to said upper surface of said non terminal portion of said second portion of said insert, said electrical conductors being insulated except at said upper surface of said first portion of said insert and at said upper surface of said terminal portion of said second portion of said insert, said insert being mounted to said base member, with said contact wall of said insert contiguous with said end wall of said base member, and with said lower surface of said insert contiguous with said insert bearing surface of said base member, whereby said upper surface of said first portion of said insert is substantially coplanar with said top surface of said base member, and said upper surface of said non-terminal portion of said second portion of said insert is substantially coplanar with said ring support surface of said base member over said selected portion of said periphery, said base member being hermetically joined by aluminum to said insert at least along said lower surface of said insert and said contact wall of said first portion of said insert;

a titanium peripheral sealing ring extending over said ring support surface of said base member and said top surface of said insert, to form a continuous flat surface about said periphery of said upper mesa, said sealing ring being hermetically joined to said ring support surface of said base member and to said upper surface of said nonterminal portion of said second portion of said insert; and a lid hermetically joined to said sealing ring, to thereby hermetically seal said GaAs chip into said housing.

* * * * *